(12) United States Patent
Koike

(10) Patent No.: US 7,692,120 B2
(45) Date of Patent: Apr. 6, 2010

(54) TRANSPORT ROBOT AND TRANSPORT APPARATUS

(75) Inventor: Toshio Koike, Kanagawa (JP)

(73) Assignee: Ulvac, Inc., Chigasaki (JP)

( * ) Notice: Subject to any disclaimer, the term of this patent is extended or adjusted under 35 U.S.C. 154(b) by 488 days.

(21) Appl. No.: 11/653,423

(22) Filed: Jan. 16, 2007

(65) Prior Publication Data
US 2007/0166135 A1    Jul. 19, 2007

Related U.S. Application Data

(63) Continuation of application No. PCT/JP2005/022616, filed on Dec. 9, 2005.

(30) Foreign Application Priority Data

Dec. 10, 2004    (JP)    ............... 2004-357778

(51) Int. Cl.
H01L 21/68    (2006.01)
B25J 18/00    (2006.01)
B25J 19/00    (2006.01)
(52) U.S. Cl. .................. 219/405; 219/392; 414/939; 700/900; 901/27; 901/50
(58) Field of Classification Search ............. None
See application file for complete search history.

(56) References Cited

U.S. PATENT DOCUMENTS 6,298,684 B1    10/2001    Mitsuyoshi ............ 62/337

6,499,777 B1 *    12/2002    Wang ....................... 414/935

FOREIGN PATENT DOCUMENTS

| JP | 5-74699 | 3/1993 |
|---|---|---|
| JP | 6-204316 | 7/1994 |
| JP | 9-94791 | 4/1997 |
| JP | 2001-35902 | 2/2001 |

OTHER PUBLICATIONS

Chinese Office Action dated Nov. 16, 2007 (English translation).

* cited by examiner

*Primary Examiner*—Joseph M Pelham
(74) *Attorney, Agent, or Firm*—Kratz, Quintos & Hanson, LLP

(57) ABSTRACT

A transport robot including a release-side high radiation ratio portion and a receive-side high radiation ratio portion that face each other. Heat in a substrate conducted to a base portion due to thermal conduction is released as radiant heat from the release-side high radiation ratio portion, and the radiant heat is absorbed by the receive-side high radiation ratio portion. The receive-side high radiation ratio portion is formed on a heat-receiving plate that is thermally connected to a vacuum chamber so that radiant heat absorbed by the receive-side high radiation ratio portion is transferred to the vacuum chamber. As a result, even in the case where the high-temperature substrate is transported in a vacuum atmosphere, heat from the substrate is not accumulated in a transport system, and the transport system hardly reaches a high temperature.

20 Claims, 3 Drawing Sheets

TRANSPORT ROBOT AND TRANSPORT APPARATUS

CROSS-REFERENCE TO RELATED APPLICATIONS

This application is a continuation of International Application No. PCT/JP2005/022616, filed on Dec. 9, 2005, the entire disclosure of which is incorporated herein by reference.

This application claims priority benefit of Japanese Application No. 2004-357778, filed on Dec. 10, 2004, the entire disclosure of which is incorporated herein by reference.

BACKGROUND OF THE INVENTION

1. Field of the Invention

The present invention generally relates to transport robots for transporting objects to be transported in a vacuum atmosphere.

2. Description of the Related Art

Conventionally, for vacuum apparatuses (such as, film forming apparatuses), a vacuum robot (transport robot) is used capable of transporting a substrate while a vacuum atmosphere is maintained in a vacuum chamber.

The vacuum robot transports unprocessed substrates and processed substrates in the vacuum chamber. A substrate after subjected to film forming process, for example, reaches a high temperature so that the vacuum robot is heated by transporting such a high-temperature substrate.

When the vacuum robot is heated in a vacuum, heat in the substrate is conducted through an arm of the vacuum robot, and ultimately escapes to the vacuum chamber through a base flange with which the vacuum robot is fixed to the vacuum chamber.

However, a rotary shaft for extending/shortening the arm of the vacuum robot (core shaft or inner cylinder for example) is supported by a bearing. In many cases a bearing has a spherical body, a small contact area and a very low thermal conductivity; and therefore, heat received from the substrate accumulates in the arm of the vacuum robot instead of escaping to the vacuum chamber.

In addition, the inner walls of the vacuum chamber are subjected to polishing by means of electropolishing or chemical polishing in order to suppress emitted gas. Accordingly, the inner wall surfaces of the vacuum chamber are very flat and have a significantly low radiation ratio. Consequently, the reflectivity of thermal energy at the inner wall surfaces of the vacuum chamber is significantly high, and the vacuum robot is also exposed to the thermal energy reflected on the inner wall surfaces of the vacuum chamber.

As described above, the thermal energy amount that the vacuum robot receives is large and the thermal energy amount that escapes from the vacuum robot is small. Consequently, the temperature of the vacuum robot gradually rises and reaches a very high temperature at which the thermal energy amount conducted to the vacuum robot and the thermal energy amount escaping from the vacuum robot are about the same.

Conventional vacuum robots are not suitable for use at a high temperature. In order to enable such a use at a high temperature, it is required to use a solid-lubricated bearing, which is expensive, to support a support shaft.

If the solid-lubricated bearing is not used, lubrication oil of the bearing evaporates when the vacuum robot reaches a high temperature in a vacuum. As a result, maintenance work is required at short-time intervals or an operation error occurs due to defective lubrication.

As a method for reducing the thermal energy amount that enters the vacuum robot, a method has been proposed in which a substrate and a thermal shield plate are placed on the arm in a superimposed state. However, if an energy amount carried to the outside of the vacuum environment (normally, the atmosphere environment) is small, the vacuum robot eventually reaches a high temperature.

The above-discussed related art are disclosed in Japanese Patent Laid-Open Publication No. Hei 5(1993)-74699, and Japanese Patent Laid-Open Publication No. Hei 6(1994)-204316.

SUMMARY OF THE INVENTION

It is an object of the present invention to provide a transport robot whose temperature does not reach a high temperature and that does not suffer an operational error even in the case of transporting high-temperature substrates in a vacuum atmosphere.

In order to solve the above-described problem, exemplary embodiments of the present invention provide a transport robot including a base portion and an arm supported by the base portion via a support shaft, and the transport robot transports a substrate by moving the arm. The base portion includes a first surface that can face the substrate, and a second surface on the opposite side to the first surface. A release-side high radiation ratio portion whose radiation ratio is made higher by surface treatment than a radiation ratio in a state prior to the surface treatment is formed on the second surface, and a heat-receiving plate for receiving heat emitted from the release-side high radiation ratio portion that is disposed such that a surface of the heat-receiving plate faces the release-side high radiation ratio portion is provided.

Exemplary embodiments of the present invention may provide the transport robot, in which on the surface of the heat-receiving plate that faces the release-side high radiation ratio portion, a receive-side high radiation ratio portion is formed whose radiation ratio is made higher by surface treatment than a radiation ratio in a state prior to the surface treatment.

Exemplary embodiments of the present invention may provide the transport robot, in which a reflector for reflecting heat is disposed on the first surface of the base portion.

Exemplary embodiments of the present invention may provide the transport robot, in which before the base portion is subjected to the surface treatment, one of a flat surface of an aluminum plate and a flat surface of stainless steel is exposed.

Exemplary embodiments of the present invention may provide the transport robot, in which the arm is plate-shaped and includes a first surface that can face the substrate and a second surface on the opposite side to the first surface, and an arm-side high radiation ratio portion whose radiation ratio is made higher by surface treatment than a radiation ratio in a state prior to the surface treatment is formed on the second surface of the arm.

Exemplary embodiments of the present invention may provide the transport robot, in which a reflector for reflecting heat is disposed on the first surface of the arm.

Exemplary embodiments of the present invention may provide the transport robot, in which the arm is configured so as to allow extension/shortening and rotation of the arm.

Exemplary embodiments of the present invention may provide the transport robot, in which the base portion is configured so as to be perpendicular to the second surface of the base portion and a surface of the heat-receiving plate that faces the second surface, and to be rotatable centering on a central axis that passes through the center of the second surface and the surface of the heat-receiving plate. The base portion is configured such that when the base portion rotates, the second surface and the surface of the heat-receiving plate are kept parallel to each other.

Exemplary embodiments of the present invention may provide the transport robot, in which the surface treatment involves increasing surface roughness by blasting particles on a flat surface.

Exemplary embodiments of the present invention may provide the transport robot, in which the surface treatment involves forming a fluororesin layer.

Exemplary embodiments of the present invention may provide a transport apparatus including a vacuum chamber and a transport robot, the transport robot including a heat-receiving plate attached to one wall surface of the vacuum chamber, a base portion disposed facing and spaced away from the heat-receiving plate, and an arm supported by the base portion via a support shaft, and the transport robot transporting a substrate by moving the arm. The base portion includes a first surface that can face the substrate, and a second surface on the opposite side to the first surface that faces the heat-receiving plate. A release-side high radiation ratio portion with a radiation ratio that is made higher by surface treatment than a radiation ratio in a state prior to the surface treatment is formed on the second surface of the base portion; and a heat-receiving plate for receiving heat emitted from the release-side high radiation ratio portion that is disposed such that a surface of the heat-receiving plate faces the release-side high radiation ratio portion is provided.

Exemplary embodiments of the present invention may provide the transport apparatus, in which the arm is plate-shaped and includes a first surface that can face the substrate and a second surface on the opposite side to the first surface; and an arm-side high radiation ratio portion with a radiation ratio that is made higher by surface treatment than a radiation ratio in a state prior to the surface treatment is formed on the second surface of the arm.

Exemplary embodiments of the present invention may provide the transport apparatus, in which in a region that is on one surface of the vacuum chamber and faces at least the second surface of the arm when the arm moves, a vacuum chamber-side high radiation ratio portion with a radiation ratio that is made higher by surface treatment than a radiation ratio in a state prior to the surface treatment is provided.

Exemplary embodiments of the present invention may provide the transport apparatus, in which on the surface of the heat-receiving plate that faces the release-side high radiation ratio portion, a receive-side high radiation ratio portion is formed with a radiation ratio that is made higher by surface treatment than a radiation ratio in a state prior to the surface treatment.

Exemplary embodiments of the present invention may provide the transport apparatus, in which a reflector for reflecting heat is disposed on the first surface of the base portion.

Exemplary embodiments of the present invention may provide the transport apparatus, in which before the base portion is subjected to the surface treatment, one of a flat surface of an aluminum plate and a flat surface of stainless steel is exposed.

Exemplary embodiments of the present invention may provide the transport apparatus, in which the arm is configured to allow extension/shortening and rotation of the arm.

Exemplary embodiments of the present invention may provide the transport apparatus, in which the base portion is configured so as to be perpendicular to the second surface of the base portion and a surface of the heat-receiving plate that faces the second surface, and to be rotatable centering on a central axis that passes through the center of the second surface and the surface of the heat-receiving plate. The base portion is configured such that when the base portion rotates, the second surface and the surface of the heat-receiving plate are kept parallel to each other.

Exemplary embodiments of the present invention may provide the transport apparatus, in which the surface treatment involves increasing surface roughness by blasting particles on a flat surface.

Exemplary embodiments of the present invention may provide the transport apparatus, in which the surface treatment involves forming a fluororesin layer.

It should be noted that "radiation ratio (emissivity)" refers to a ratio between the thermal emission brightness of an object and the thermal emission brightness of the blackbody at the same temperature. Emissivity can be defined in various manners depending on the wavelength, orientation of emission, deflection factor or the like. In case of a pure substance that has a sufficient thickness and flat surface, the emissivity depends on the type, temperature and wavelength of the substance, and has a simple relation with the optical constant. However in other cases, the emissivity depends on various factors. In such other cases, the emissivity is also called "effective emissivity". When a substance has a rough surface or depressed surface, the effective emissivity increases. (Extracted from the chapter of "Emissivity", "Iwanami Physical and Chemical Dictionary", supplemented third edition, second edition of the supplemented third edition published by Iwanami Shoten on Oct. 20, 1981, p.1265)

The radiation ratio of the present application refers to the above-described effective emissivity. The effective emissivity per unit area of the high radiation ratio portion is lower than the effective emissivity per unit area of the base portion surface before subjected to surface treatment.

The present invention has a configuration as described above, and when the arm is moved with a substrate being placed on a hand that is provided in the arm, the substrate is transported as placed on the hand as a result of the arm moving.

When a high-temperature substrate is transported in a vacuum atmosphere, heat in the substrate is transferred from the substrate due to radiation or thermal conduction.

When a high-temperature substrate is placed on the hand, the pathway through which heat in the substrate is conducted due to thermal conduction is as follows: from hand to arm, from arm to support shaft, from support shaft to base portion. When the base portion is attached to the vacuum chamber via an attaching member, heat transferred to the base portion is transferred from the base portion to the vacuum chamber via the attaching member.

Even if the transferred heat amount is the same, the higher the radiation ratio is, the more easily electromagnetic waves including infrared ray (radiant heat) is emitted. Therefore, with respect to the member (a release-side member) disposed in the pathway through which heat in the substrate is conducted to the vacuum chamber due to thermal conduction, and a receive-side member having a surface that faces a surface of the release-side member, by subjecting the surface of at least one of the above members to surface treatment to increase the radiation ratio, thermal resistance in the space between the release-side member and the receive-side member decreases. As a result, heat in the substrate is directly transferred from the release-side member to the receive-side member due to radiation without passing the thermal conduction pathway.

For example, when a release-side high radiation ratio portion is provided in the base portion as the release-side member, and a high radiation ratio portion is provided on a surface of a heat-receiving plate that faces the release-side high radiation ratio portion as the receive-side member, heat in the base portion is emitted from the release-side high radiation ratio portion and enters the receive-side high radiation ratio portion that faces the release-side high radiation ratio portion.

Even if the energy amount of incident electromagnetic waves is the same, the higher the radiation ratio is, the smaller the reflectivity of the electromagnetic wave is. Therefore, the receive-side high radiation ratio portion absorbs a large amount of electromagnetic waves, which is converted to heat in the heat-receiving plate.

The heat-receiving plate is thermally connected to the vacuum chamber by being attached in close contact or attached via a thermally-conductive member to the vacuum chamber. Heat converted in the heat-receiving plate is conducted to the vacuum chamber due to thermal conduction and released to the outside from the vacuum chamber. Accordingly, even in the case where the base portion is not thermally connected to the vacuum chamber or in the case where the heat amount transferred to the vacuum chamber is small, the base portion or the arm hardly reaches a high temperature.

There is no limitation to the heat-receiving plate so long as it is thermally connected to the vacuum chamber. The heat-receiving plate may be configured with a flange that connects a transport system to the vacuum chamber or may be configured using a portion of the vacuum chamber.

When the substrate moves above the base portion, by providing the release-side high radiation ratio portion in the lower portion of the base portion, the release-side high radiation ratio portion does not directly face the substrate. Therefore, radiant heat from the substrate hardly enters the release-side high radiation ratio portion.

Since the receive-side high radiation ratio portion is formed on the heat-receiving plate that is thermally connected to the vacuum chamber, even if the receive-side high radiation ratio portion faces the substrate, and radiant heat from the substrate enters the receive-side high radiation ratio portion, heat converted in the heat-receiving plate is transferred to the vacuum chamber; and ultimately, heat from the substrate escapes to the vacuum chamber.

In a transport robot of the present invention, even when thermal energy flows into the transport robot due to radiation or thermal conduction from a heated substrate, the thermal energy that flows in is released from the release-side high radiation ratio portion, and the released thermal energy is transferred from the receive-side high radiation ratio portion to the vacuum chamber; and consequently, thermal energy is not accumulated in the transport robot. Accordingly, even when the arm of the transport robot is placed in a vacuum atmosphere, it is possible to suppress temperature rising and evaporation of lubrication oil used for bearings of the transport robot. As a result, the transport robot of the present invention suffers less operational errors, which reduces frequency of maintenance work. Also, since the arm temperature of the transport robot of the present invention is kept low, the effect of extension of the arm due to thermal expansion is small. Therefore, in addition to the fact that the reproducibility of the substrate position when holding the substrate does not deteriorate, the amount of emitted gas released from the robot arm is also small.

Figure 1:
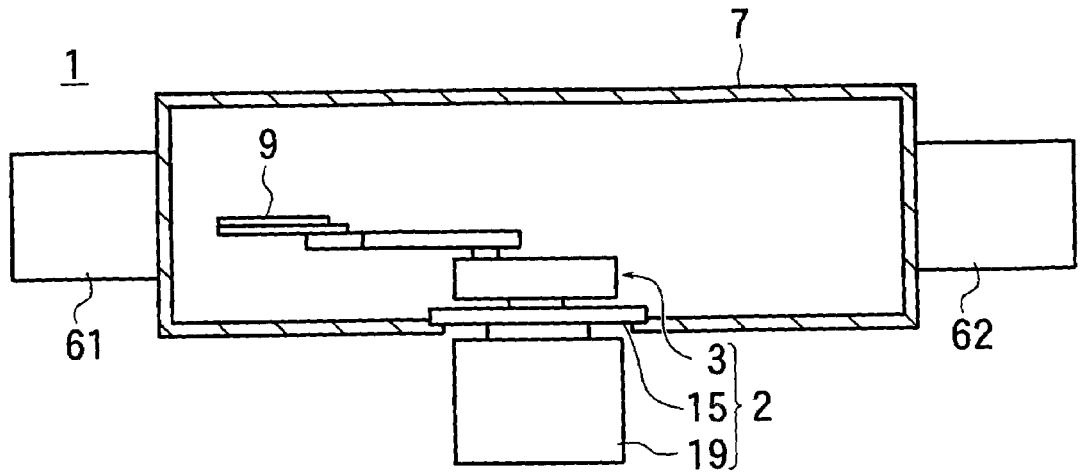
FIG. 1 is a cross-sectional view illustrating a state in which a transport robot is attached to a vacuum chamber.

In the figures, the reference numerals correspond to the respective element as follows; 1, 50: transport apparatus, 2: transport robot 3: transport system, 7: vacuum chamber, 9: substrate, 15: base flange (heat-receiving plate), 19: motor portion, 20: arm, 22: arm-side high radiation ratio portion, 23, 47: reflector, 30: base portion, 41: release-side high radiation ratio portion, 42: receive-side high radiation ratio portion, and 52: vacuum chamber-side high radiation ratio portion.

DETAILED DESCRIPTION OF PREFERRED EMBODIMENTS

Reference numeral 1 in FIG. 1 shows an example of a transport apparatus of the present invention, and the transport apparatus 1 has a transport robot 2 and a vacuum chamber 7.

The transport robot 2 has a plate-shaped base flange 15, a motor portion 19 (driving system) for generating driving force that is located on one surface side of the base flange 15, and a transport system 3 for moving a substrate described below with the driving force generated by the motor portion 19, the transport system 3 being located on the other surface side of the base flange 15.

A through hole having a smaller diameter than that of the planer shape of the base flange 15 is formed at the bottom wall of the vacuum chamber 7. The transport robot 2 is attached such that the transport system 3 is disposed inside the vacuum chamber 7, and the motor portion 19 is disposed outside the vacuum chamber 7, with the rim portion of the base flange 15 closely contacted with the area around the through hole. As a result, the through hole is covered by the base flange 15.

Figure 2:
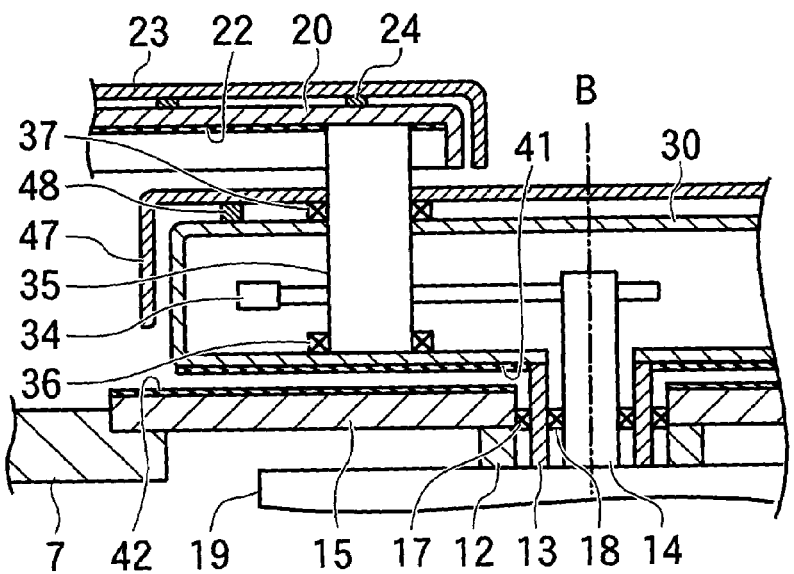
FIG. 2 is an enlarged cross-sectional view showing a portion in the vicinity of a base flange of the transport robot.

FIG. 2 shows an enlarged cross-sectional view showing a portion in the vicinity of the base flange 15 of the transport robot. The base flange 15, which has a through hole provided in the central area thereof, is ring-shaped.

Around the through hole of the base flange 15, the upper end of an outer cylinder 12 having an inner diameter larger than the diameter of the through hole is attached in close contact with the area around the though hole. The lower end of the outer cylinder 12 extends vertically below, to which the motor portion 19 is attached. Accordingly, the motor portion 19 is attached to the base flange 15 via the outer cylinder 12.

The motor portion 19 has two drive shafts that generate driving force independently. An inner cylinder 13 is inserted into the outer cylinder 12. A core shaft 14 is inserted into the inner cylinder 13. The lower ends of the inner cylinder 13 and the core shaft 14 are respectively attached to separate drive shafts so that the inner cylinder 13 and the core shaft 14 rotate independently.

Shaft supporting portions 17 and 18 that have a bearing are respectively disposed between the inner cylinder 13 and the outer cylinder 12 and between the inner cylinder 13 and the core shaft 14. The inner cylinder 13 and the core shaft 14 are supported by the shaft supporting portions 17 and 18 so as to have a common central axis B. The inner cylinder 13 and the core shaft 14 rotate centering on the central axis B.

A shaft sealing portion is disposed below each of the shaft supporting portions 17 and 18, although they are not shown in FIG. 2. These shaft sealing portions shield the vacuum atmosphere in the vacuum chamber 7 from the outside air atmosphere.

The transport system 3 has a base portion 30, a support shaft 35 and an arm 20. The base portion 30 is hollow, and its bottom wall is fixed to the upper end of the inner cylinder 13. When the inner cylinder 13 rotates, the base portion 30 also rotates centering on the central axis B together with the inner cylinder 13.

The upper end of the inner cylinder 13 protrudes upward from the surface of the base flange 15 so that the base portion 30 and the base flange 15 are spaced away from each other. The central axis B is perpendicular to both of the surface of the base portion 30 that faces the base flange 15 and the surface of the base flange 15 that faces the base portion 30. When the base portion 30 rotates, the surface of the base portion 30 that faces the base flange 15 and the surface of the base flange 15 that faces the base portion 30 are kept parallel to each other. Consequently, the base portion 30 and the base flange 15 are kept away from each other such that the base portion 30 and the base flange 15 are not rubbed against each other.

The bottom of the support shaft 35 is attached to the base portion 30, and the base end portion of the arm 20 is attached to the top of the support shaft 35. When the base portion 30 rotates, the arm 20 rotates together with the support shaft 35 centering on the same central axis B.

A through hole is formed in the bottom wall of the base portion 30 at the position located just above the upper end of the inner cylinder 13. The upper portion of the core shaft 14 penetrates the through hole, extending to the inside of the base portion 30.

In the base portion 30, a rotational force transmission system 34 is disposed, and the rotational force of the core axis 14 is transmitted to the support shaft 35 through the rotational force transmission system 34.

A shaft bearing portion is disposed between the support shaft 35 and the base portion 30. In this case, a first shaft bearing portion 36 is disposed between the lower end of the support shaft 35 and the inner wall on the bottom wall side of the base portion 30; and a second shaft bearing portion 37 is disposed between an upper portion of the support shaft 35 and the exterior wall on the ceiling side of the base portion 30.

The first and second shaft bearing portions 36 and 37 are configured such that when rotational force of the core axis 14 is transmitted to the support shaft 35, such rotational force is transmitted to the support shaft 35 without being transmitted to the base portion 30 so as to rotate the support shaft 35 centering on the central axis thereof.

The arm 20 has a link mechanism (not shown). When the support shaft 35 rotates, the link mechanism operates to extend/shorten the arm 20.

Figure 3:
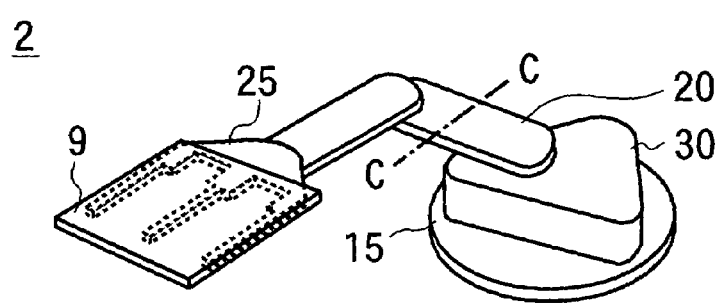
FIG. 3 is a perspective view of the transport robot when viewed from above.

FIG. 3 is a perspective view of a portion disposed on the side of the vacuum chamber 7 of the transport robot 2. A hand 25 is attached to the top end of the arm 20. A substrate 9, which is an object to be transported, is placed on the hand 25.

Since the hand 25 is configured to move together with the arm 20, the substrate 9 on the hand 25 is transported to a desired position as a result of extension/shortening of the arm 20 and rotation of the base portion 30.

As described above, the base flange 15 closely contacts the area around the through hole of the bottom wall of the vacuum chamber 7. The outer cylinder 12 is attached in close contact to the area around the through hole of the base flange 15. Thus, the inside of the vacuum chamber 7 is shielded from the outside atmosphere.

Accordingly, when the inside of the vacuum chamber 7 is evacuated with a vacuum pump (not shown) that is connected to the vacuum chamber 7, the substrate 9 and the transport system 3 are placed in a vacuum atmosphere created in the vacuum chamber 7, and the substrate 9 is transported in that vacuum atmosphere.

Here, a process room 61 and a post-process room 62 are connected to the vacuum chamber 7, and a vacuum atmosphere is created inside the process room 61 and the post-process room 62 as inside the vacuum chamber 7. In the process room 61, a substrate 9 having a temperature that has been raised to a high temperature as a result of processes (such as, film formation or etching) is disposed. When the hand 25 is put in the process room 61 by extending the arm 20, and then the arm 20 is shortened after holding the substrate 9 with the hand 25, the substrate 9 is transported to the inside of the vacuum chamber 7. When the arm 20 is extended after changing the orientation of the hand 25 by rotating the arm 20, the hand 25 is transported to the inside of the post-process room 62 together with the substrate 9, and the substrate 9 is delivered to the inside of the post-process room 62.

The hand 25, the arm 20, the support shaft 35 and the base portion 30 are composed of thermally-conductive materials (such as, aluminum or stainless steel), and heat convection does not occur in a vacuum atmosphere. Therefore, after the transport robot 2 receives the substrate 9 from the process room 61 until the transport robot 2 finishes delivery of the substrate 9 to the post-process room 62, heat other than heat released from the substrate 9 due to radiation is conducted to the hand 25, the arm 20, the support shaft 35 and the base portion 30 due to thermal conduction.

As described above, the base flange 15 and the base portion 30 are spaced away from each other, and the base portion 30 is connected to the base flange 15 via the inner cylinder 13, the shaft supporting portion 17 and the outer cylinder 12. However, since the bearing of the shaft supporting portion 17 has a low thermal conductivity, the heat amount that escapes from the base portion 30 to the base flange 15 due to thermal conduction is small.

In the transport robot 2 of the present invention, the base portion 30 is located above the base flange 15, and therefore the back surface (second surface) of the base portion 30 faces the top surface of the base flange 15.

The back surface of the base portion 30 and the top surface of the base flange 15 are subjected to surface treatment as described below to form a release-side high radiation ratio portion 41 and a receive-side high radiation ratio portion 42. Taking the radiation ratio on the flat surface of the base portion 30 prior to the surface treatment as the pre-treatment radiation ratio, the pre-treatment radiation ratio is not more than 0.4 for the base portion 30 made of stainless steel, not less than 0.05 and not more than 0.2 for the base portion 30 made of aluminum. After the surface treatment, the radiation ratio of the release-side high radiation ratio portion 41 and that of the receive-side high radiation ratio portion 42 exceed 0.4, which is higher than the pre-treatment radiation ratio of the base portion 30.

As described above, since the back surface of the base portion 30 faces the top surface of the base flange 15, the release-side high radiation ratio portion 41 faces the receive-side high radiation ratio portion 42. Heat in the base portion 30 is converted to electromagnetic wave (infrared ray, for example) and emitted from the release-side high radiation ratio portion 41, and the infrared ray enters the receive-side high radiation ratio portion 42.

The base flange 15 is composed of a thermally-conductive material (such as, aluminum or stainless steel) and attached in close contact with the vacuum chamber 7. Therefore, when the infrared ray that enters the receive-side high radiation ratio portion 42 is converted to heat, the heat is transferred from the base flange 15 to the vacuum chamber 7, and released from the exterior wall surfaces of the vacuum chamber 7 to outside atmosphere (air) or to the ground.

In this way, in the transport robot 2 of the present invention, heat in the transport system 3 is transferred to a heat receiving plate that is the base flange 15 so that the transport system 3 placed in a vacuum atmosphere is efficiently cooled.

The through hole of the base portion 30 is formed in the central area of the bottom wall, and the base flange 15 is plate-shaped with a through hole formed in the central area thereof. Therefore, the release-side high radiation ratio portion 41 and the receive-side high radiation ratio portion 42 are ring-shaped.

The inner cylinder 13 penetrates substantially the center of the through hole of the base flange 15. The central axis passes through inside the ring of the release-side high radiation ratio portion 41 and the ring of the receive-side high radiation ratio portion 42, and also passes through the center of the release-side high radiation ratio portion 41 and the center of the receive-side high radiation ratio portion 42.

The central axis of the inner cylinder 13 and the rotational central axis B coincide; and as described above, the surface of the base portion 30 that faces the base flange 15 and the surface of the base flange 15 that faces the base portion 30 are kept parallel to each other during rotation of the base portion 30. Therefore, when the release-side high radiation ratio portion 41 rotates centering on the central axis B as the base portion 30 rotates, the area in which the release-side high radiation ratio portion 41 and the receive-side high radiation ratio portion 42 face each other is constant. When the heat transfer amount to the base portion 30 is constant, a constant amount of radiant heat enters at any time from the release-side high radiation ratio portion 41 to the receive-side high radiation ratio portion 42.

When changing the orientation of the arm 20 by rotating the base portion 30, the base portion 30 is rotated after the arm 20 is shortened in order to reduce the centrifugal force that acts on the substrate 9. When the arm 20 is shortened, the high-temperature substrate 9 is disposed above the base portion 30. Therefore, the top surface (first surface) of the base portion 30 can face the substrate 9.

A reflector 47 for reflecting electromagnetic waves (such as, infrared ray) is disposed above the base portion 30. For example, the reflector 47 is constituted by a mirror having a mirror surface that reflects electromagnetic waves, and the mirror is attached such that the mirror surface faces upward and covers the top surface and a part of the side faces of the base portion 30. Therefore, radiant heat from the substrate 9 is reflected on the mirror surface of the reflector 47; thus, the radiant heat from the substrate 9 does not enter the base portion 30. The reflector 47 is attached to the base portion 30 with a spacer 48 made up of a heat insulating material sandwiched between the reflector 47 and the base portion 30 so that the base portion 30 and the reflector 47 do not contact each other. Consequently, even if the temperature of the reflector 47 rises, heat in the reflector 47 is not transferred to the arm 20.

In this way, since the radiant heat from the substrate 9 is reflected by the reflector 47, and heat conducted from the substrate 9 due to thermal conduction escapes to the vacuum chamber 7 through the base flange 15, the arm 20 and the base portion 30 hardly reaches a high temperature even if they are placed in a vacuum atmosphere.

Consequently, even when a bearing to which lubrication oil is applied is used for the first and second shaft bearing portions 36 and 37 or the shaft supporting portions 17 and 18, since the lubrication oil does not evaporate, maintenance work is required less frequently, and in addition, an operational error is less likely to occur.

It is possible to provide the high radiation ratio portion and the reflector in the arm 20, in addition to the base portion 30.

Figure 4:
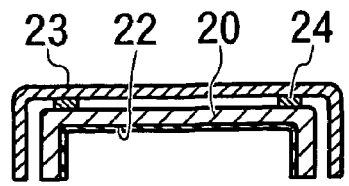
FIG. 4 is a cross-sectional view of an arm taken along line C-C of FIG. 3.

FIG. 4 is a cross-sectional view taken along the line C-C of FIG. 3. The back surface (second surface) of the arm 20 is subjected to the above-described surface treatment, and an arm-side high radiation ratio portion 22 that has a higher radiation ratio than the pre-treatment radiation ratio of the base portion 30 is formed. Accordingly, heat in the arm 20 is released to the outside due to radiation from the arm-side high radiation ratio portion 22, in addition to thermal conduction to the support shaft 35 and the base portion 30.

A reflector 23 is attached to the top surface (first surface) of the arm 20 with a spacer 24 made up of a heat insulating material sandwiched between the reflector 23 and the arm 20, and the mirror surface of the reflector 23 is faced upward. Accordingly, even if the high-temperature substrate 9 is located above the arm 20 when the arm 20 is shortened, radiant heat from the substrate 9 is reflected by the reflector 23.

Here, the arm 20 is plate-shaped, and in a state in which the arm 20 is extended straight, both side portions along the straight line of the arm 20 are bent toward the side opposite to the mirror surface of the reflector 23. Such bent portions form a convex shield portions. Consequently, the arm-side high radiation ratio portion 22 is located between the shield portions, and therefore thermal energy reflected by the reflector 23 is shielded by the shield portions and does not enter the arm-side high radiation ratio portion 22. As a result, the arm 20 hardly reaches a high temperature, and thermal deformation of the arm 20 is less likely to occur.

The case in which a high radiation ratio portion is provided on the second surface, which is the back surface of the arm 20, is described above. However, the present invention is not limited to this. For example, in the case where the hand holds the substrate 9 below the arm 20, and the substrate 9 moves below the arm 20 as a result of extension/shortening of the arm 20, it is preferable that the top surface of the arm 20 serves as the second surface and a high radiation ratio portion is provided thereon, and the back surface of the arm 20 serves as the first surface and the reflector 23 is provided thereon.

Furthermore, in the case where the substrate 9 moves at a position below the base portion 30, it is preferable that the wall surface on the side of the ceiling of the base portion 30 serves as the second surface and the release-side high radiation ratio portion is provided thereon, the heat-receiving plate is disposed above the base portion 30 with the surface thereof on the side on which the receive-side high radiation ratio portion is provided facing the release-side high radiation ratio portion; and further, the surface on the bottom side of the base portion 30 serves as the first surface and the reflector is provided thereon.

In short, in the present invention, the reflector is disposed at the position (first surface) that faces the substrate 9, and the receive-side high radiation ratio portion is provided on the surface (second surface) that does not face the substrate 9; thereby, preventing radiant heat from the substrate 9 from entering the transport system 3. Also in the present invention, heat conducted due to thermal conduction is efficiently released by causing the receive-side high radiation ratio portion to face the release-side high radiation ratio portion.

By providing cooling means in the vacuum chamber to which the transport robot is attached such that the vacuum chamber is cooled by the cooling means, heat that enters the receive-side high radiation ratio portion 42 is released more smoothly.

Materials used for the base portion 30 and the arm 20 are not limited to stainless steel and aluminum. Other types of metal or alloy can be used provided that it is possible to form by surface treatment a high radiation ratio portion having a higher radiation ratio than the pre-treatment radiation ratio. Further, in addition to the surface treatment described below, it is possible to form the high radiation ratio portion by constituting a portion of the base portion 30 and the arm 20 where the high radiation ratio portion is to be formed with metal materials that has a higher radiation ratio than other portions.

The case in which the reflectors 23, 47, which are mirrors, are disposed on the surface that faces the substrate 9 is described above. However, the present invention is not limited to this. By polishing the surface of the base portion 30 or the arm 20 that faces the substrate 9 to form a low radiation ratio portion having a lower radiation ratio than the radiation ratio prior to polishing, thermal energy emitted from the substrate 9 is reflected without disposing the reflector 23, 47 because the reflectivity of radiant heat becomes higher than in the case in which polishing is not performed.

The surface treatment method for improving the radiation ratio will be specifically described. Examples of such a treatment method include a method for forming a layered high radiation-ratio portion having a high surface roughness by making a flat surface of a treatment target uneven using a GBB (glass beads blast) method that involves blasting glass beads or a sand blast method that involves blasting steel particles, sand or the like, or a fluorine coating treatment in which liquid fluororesin material is applied to a treatment target to form a coating layer, then the coating layer is heated to form a layered high radiation ratio portion made up of fluororesin layer having a surface that has a high radiation ratio.

Further, a spraying method can be used in which a base material (such as, ceramics) is melted and the melted base material is sprayed onto a treatment target to form a layered high radiation ratio portion.

In the above fluorine coating treatment, fluororesin material can be heated until it is blackened (blackening process) when the coating layer is heated. Since black color has a higher radiation ratio than other colors, the radiation ratio of the high radiation ratio portion is increased by the blackening process.

The receive-side high radiation ratio portion, the release-side high radiation ratio portion and the arm-side high radiation ratio portion may be subjected to the same surface treatment or may be subjected to different surface treatments.

In order to verify the heat releasing property of the above-described surface treatments, the following heat release test was conducted.

[Heat Release Test]

A heating plate is disposed suspended in a vacuum chamber so that the heat transfer amount to the vacuum chamber is kept small, and test pieces described below are disposed in the vacuum chamber such that the front faces of the test pieces face the front face of the heating plate. A vacuum atmosphere at a predetermined pressure is created and maintained in the vacuum chamber. Then, the temperatures of the front face of the heating plate and the back faces of test pieces were measured while applying current to the heating plate. After the heating plate has reached approximately 120 degrees centigrade, the applied current amount was controlled so as to maintain that temperature.

In this vacuum chamber, test pieces of aluminum plate is delivered while maintaining the vacuum atmosphere and disposing the test pieces such that the front faces of the test pieces face the heating plate with its temperature kept at 120 degrees centigrade. Then, the temperature of the back faces of the test pieces that do not face the heating plate was measured.

Here, the following four types of test pieces A to D were used.

A: Test piece whose front and back faces are respectively subjected to electropolishing.

B: Test piece whose front face was subjected to electropolishing, and whose back face was subjected to surface treatment by the GBB method.

C: Test piece whose front and back faces are respectively subjected to electropolishing.

D: Test piece whose front face was subjected to electropolishing, and its back face was subjected to surface treatment by fluorine coating treatment (including blackening process).

Of the above test pieces A to D, as the test pieces A, B and D, an aluminum plate formed by rolling was used, and as the test piece C, an aluminum plate formed by molding was used. The temperature measurement results of the back faces of the test pieces A to D are indicated in FIG. 5 together with the temperature measurement results of the front face of the heating plate (heated face).

Figure 5:
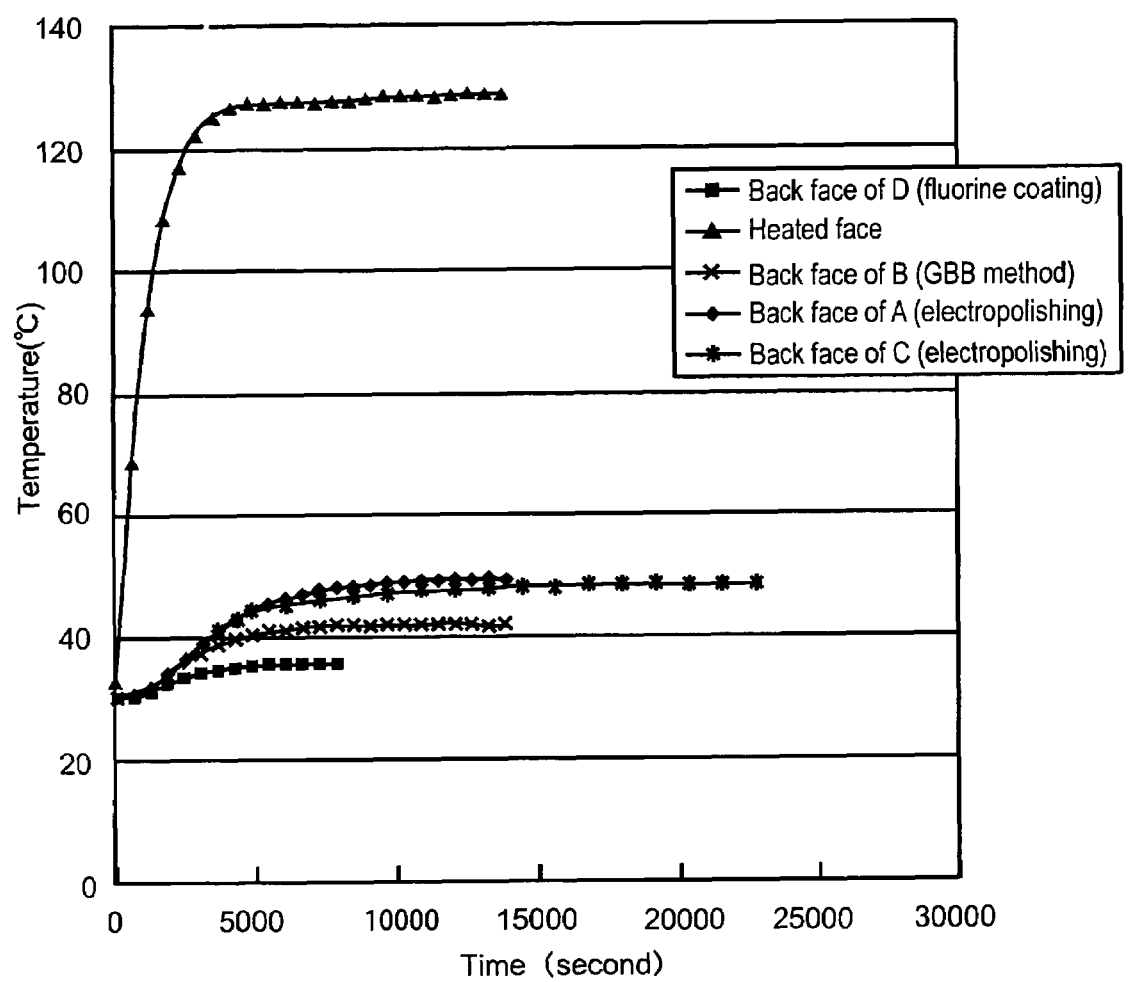
FIG. 5 is a graph showing the relation between a temperature measured at the heat release test and time.

As clearly observed from FIG. 5, for the test pieces A and C having back faces that were subjected to electropolishing, the temperature of the back face rose significantly. The reason for this is estimated as follows: the flatness of the back face increased as a result of the electropolishing, which decreased the radiation ratio, and resulted in a little radiant heat from the back face.

On the other hand, for the test piece B having surface roughness on the back face thereof that was increased by the GBB method and the test piece D on the back face of which a fluororesin film was formed by fluorine coating treatment, the temperature on the back faces showed a smaller degree of increase compared with the test pieces A and C. As a result, even when the same aluminum plate is heated under the same heating condition, after the above-described surface treatment was performed, the emission amount of radiant heat is larger than the emission amount prior to the surface treatment. Therefore, it is understood that the surface treatment that has the effect of preventing the temperature of the aluminum plate from rising.

More particularly, the test piece D showed a smaller temperature rise than the test piece B; and it is estimated that fluorine coating treatment has the effect of allowing a larger amount of radiant heat to be emitted than the treatment for increasing surface roughness. However, when the fluororesin film reaches a high temperature, contaminant gas may be emitted in the vacuum atmosphere. Therefore, when the substrate 9 may be contaminated by such a contaminant gas, or the temperature of the substrate 9 is significantly high, it is preferable to form the high radiation ratio portion by increasing surface roughness.

The case in which a high radiation ratio portion is formed in the transport robot is described above. However, the present invention is not limited to this. For example, by subjecting the inner wall surface of the vacuum chamber 7 to the above-described surface treatment to form a high radiation ratio portion having a higher radiation ratio than the pre-treatment radiation ratio of the base portion 30, radiant heat from the substrate 9 is absorbed at the high radiation ratio portion and released from the external portion of the vacuum chamber, and the temperature of the base portion 30 rises less easily.

However, when the inner wall of the vacuum chamber is subjected to surface treatment, it is likely that water or contaminant gas from the fluororesin is generated. If such a contaminant gas gives adverse effects on the substrate, it is not preferable to perform the surface treatment to the vacuum chamber.

The transfer robot that transports substrates by extension/shortening and rotation of the arm was described so far. However, the present invention is not limited to this.

For example, the present invention also includes a transport robot including a transport system that levitates due to the magnetic force generated by magnetic field generation means, and rotates or horizontally moves together with the substrate, as well as so-called "XY stage" for positioning the substrate.

In any case, by forming the release-side high radiation ratio portion on the surface of the transport system on the side opposite to the surface that faces the substrate, forming the receive-side high radiation ratio portion in the vacuum chamber or a member (heat-receiving plate) thermally connected to the vacuum chamber, and disposing the release-side high radiation ratio portion and the receive-side high radiation ratio portion facing each other, heat in the transport system enters from the release-side high radiation ratio portion to the receive-side high radiation ratio portion and promptly transferred to the vacuum chamber. Consequently, the transport system does not reach a high temperature even in a vacuum atmosphere. Further, by disposing the above-described reflector on the surface of the transport system that faces the substrate, radiant heat from the substrate does not directly enter the transport system; and therefore, the temperature of the transport system rises even less easily.

Next, another example of the transport apparatus of the present invention is described.

Figure 6:
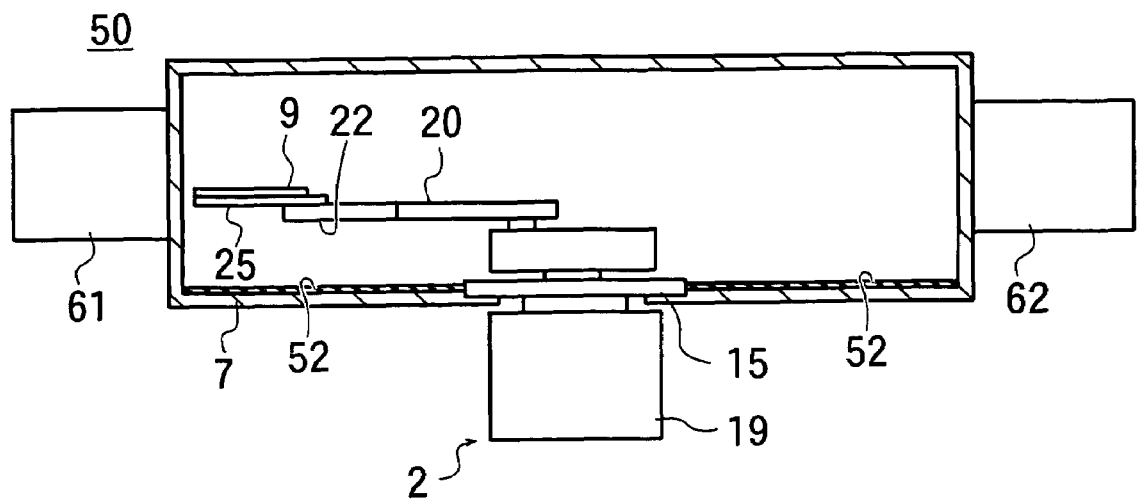
FIG. 6 is a cross-sectional view illustrating another example of a transport apparatus of the present invention.

Reference numeral 50 in FIG. 6 shows the transport apparatus of the present invention. This transport apparatus 50 has the same configuration as the transport apparatus 1 shown in FIG. 1 except that a high radiation ratio portion (described later) is formed on the inner wall surface of the vacuum chamber 7.

In the transport apparatus 50, as the transport apparatus 1 shown in FIG. 1, the substrate 9 is disposed on the hand 25, and when the arm 20 is shortened, the top surface of the arm 20 serves as the first surface being capable of facing the substrate 9, the surface of the arm 20 on the side opposite to the side on which the substrate 9 is disposed (i.e., the back surface), serves as the second surface; and the above-described arm-side high radiation ratio portion 22 having a radiation ratio not less than 0.4 is formed on the back surface.

In this case, of the inner wall surfaces of the vacuum chamber 7, the bottom wall surface of the vacuum chamber 7 is subjected to surface treatment to form a vacuum chamber-side high radiation ratio portion 52 having a higher radiation ratio than the radiation ratio prior to the surface treatment.

The arm 20 extends/shortens or rotates in a state in which the second surface faces the bottom wall surface of the vacuum chamber 7. Therefore, the arm-side high radiation ratio portion 22 always faces the vacuum chamber-side high radiation ratio portion 52, and heat in the arm 20 is emitted from the arm-side high radiation ratio portion 22 as electromagnetic waves such as infrared ray and enters the vacuum chamber-side high radiation ratio portion 52. Consequently, heat in the arm 20 is transferred to the vacuum chamber 7. As described above, since the exterior wall surfaces of the vacuum chamber 7 are in contact with the outside atmosphere, heat transferred to the vacuum chamber 7 are transferred from the exterior wall surfaces to the outside and cooled.

By providing the vacuum chamber-side high radiation ratio portion 52 in the vacuum chamber 7, heat in the arm 20 is directly transferred to the vacuum chamber 7, and therefore the heat release efficiency from the arm 20 is improved compared with the case in which the vacuum chamber-side high radiation ratio portion 52 is not provided, and thermal deformation of the arm 20 occurs less easily.

The case in which the vacuum chamber-side high radiation ratio portion 52 is provided over the entire bottom wall surface of the vacuum chamber 7 is described above. However, the present invention is not limited to this, and it is sufficient that the vacuum chamber-side high radiation ratio portion 52 is formed at least in a region over which the arm-side high radiation ratio portion 22 moves.

Specifically, of the bottom wall surface of the vacuum chamber 7, if the vacuum chamber-side high radiation ratio portion 52 is provided in a region over which the arm 20 moves when the arm 20 is rotated 360 degrees in a state in which the arm 20 is extended straight, the arm-side high radiation ratio portion 22 faces the vacuum chamber-side high radiation ratio portion 52 without fail. It should be noted that "a state in which the arm 20 is extended straight" refers to a state in which the linear distance from the rear end portion to the front end of the arm 20 is longest.

The surface on which the vacuum chamber-side high radiation ratio portion 52 is provided is not limited to the bottom wall surface of the vacuum chamber 7. As described above, in the case where the substrate 9 moves below the arm 20, and the back surface of the arm 20 serves as the first surface and the top surface of the arm 20 serves as the second surface and the arm-side high radiation ratio portion is provided on the second surface, it is preferable to provide the arm-side high radiation ratio portion on the inner wall surface of the vacuum chamber 7 that faces the second surface of the arm 20 (i.e., the ceiling of the vacuum chamber 7).

In addition, when the substrate 9 faces a side face of the arm 20, the side face of the arm 20 that can face the substrate 9 serves as the first surface, and the side face on the side opposite to the above side face serves as the second surface. The arm-side high radiation ratio portion is formed on the second surface, and of inner wall surfaces of the vacuum chamber 7, the vacuum chamber-side high radiation ratio portion is formed on the side face that faces the second surface of the arm 20.

In short, it is sufficient that the arm-side high radiation ratio portion 22 is disposed on the surface on the side opposite to the surface of the arm 20 that faces the substrate 9, and the vacuum chamber-side high radiation ratio portion is provided, of inner wall surfaces of the vacuum chamber 7, at least in a region of the surface that faces the second surface of the arm 20 over which the arm 20 moves.

It is not required to provide both the vacuum chamber-side high radiation ratio portion 52 and the arm-side high radiation ratio portion 22. As shown in FIG. 1, even in the cases where only the arm-side high radiation ratio portion 22 is provided, or to the contrary, only the vacuum chamber-side high radiation ratio portion 52 is provided without providing the arm-side high radiation ratio portion 22, heat in the arm 20 more easily escapes than in the case where neither the vacuum chamber-side high radiation ratio portion 52 nor the arm-side high radiation ratio portion 22 is provided. However, in view of releasing heat in the arm 20 more efficiently, it is preferable to provide both of the arm-side high radiation ratio portion 22 and the vacuum chamber-side high radiation ratio portion 52.

The surface treatment method for forming the vacuum chamber-side high radiation ratio portion 52 is not particularly limited. The above-described GBB method, sand blast method, fluorine coating treatment, spray method or the like can be used.

Also when the vacuum chamber-side high radiation ratio portion 52 is provided, as shown in FIG. 4, by attaching the reflector 23 to the surface of the arm 20 on the side opposite to the side on which the arm-side high radiation ratio portion 22 is formed, radiant heat from the substrate 9 is reflected by the reflector 23, and the temperature of the arm 20 rises less easily.

In the case where the arm-side high radiation ratio portion 22 is provided in the arm 20, and the vacuum chamber-side high radiation ratio portion 52 is further provided in the vacuum chamber 7, as shown in FIG. 4, it is preferable to form shield portions of a convex shape in both end portions of the arm 20.

By forming the shield portion in the arm 20, not only does heat reflected by the reflector hardly enter the arm-side high radiation ratio portion 22 as described above, but also the surface area of the arm-side high radiation ratio portion 22 increases by the height of the shield portion, and the apparent radiation ratio increases. As a result, even if the area of the vacuum chamber-side high radiation ratio portion 52 that faces the arm-side high radiation ratio area 22 is small, heat is efficiently transferred from the arm 20 to the vacuum chamber 7.

Figure 7:
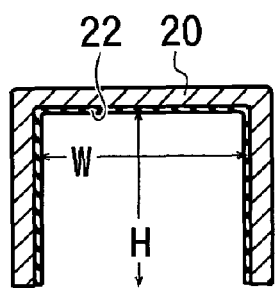
FIG. 7 is a cross-sectional view illustrating the shape of an arm.

When the distance from the plane before both ends of the arm 20 are bent toward the front end of the shield portion formed by bending the both ends is represented by a height H, and the distance from the shield portion at one end side of the arm 20 to the shield portion at the other end side of the arm 20 is represented as a width W (FIG. 7), by setting the height H to be equal to or larger than the width W, it is possible to significantly improve the thermal emission from the arm 20, and the arm 20 hardly reaches a high temperature.

The invention claimed is:

1. A transport robot, comprising:
   a base portion; and
   an arm supported by the base portion via a support shaft, and
   the transport robot transporting a substrate by moving the arm,
   wherein the base portion includes a first surface that can face the substrate, and a second surface on the opposite side to the first surface,
   wherein a low radiation ratio portion is formed on the first surface,
   wherein a release-side high radiation ratio portion having a radiation ratio that is higher than a radiation ratio of the first surface is formed on the second surface, and
   wherein a heat-receiving plate for receiving heat emitted from the release-side high radiation ratio portion is provided, the heat-receiving plate being disposed such that a surface of the heat-receiving plate faces the release-side high radiation ratio portion.

2. The transport robot according to claim 1, wherein on the surface of the heat-receiving plate that faces the release-side high radiation ratio portion, a receive-side high radiation ratio portion having a radiation ratio that is higher than a radiation ratio of the first surface of the base portion is formed.

3. The transport robot according to claim 1, wherein a reflector for reflecting heat is disposed on the first surface of the base portion.

4. The transport robot according to claim 1, wherein before the second surface of the base portion is subjected to a surface treatment for making radiation ratio thereof higher than a radiation ratio of the first surface, one of a flat surface of an aluminum plate and a flat surface of stainless steel is exposed.

5. The transport robot according to claim 1, wherein the arm is plate-shaped and includes a first surface that can face the substrate and a second surface on the opposite side to the first surface, a low radiation ratio portion is formed on the first surface of the arm, and an arm-side high radiation ratio portion having radiation ratio that is higher than a radiation ratio of the first surface of the arm is formed on the second surface of the arm.

6. The transport robot according to claim 5, wherein a reflector for reflecting heat is disposed on the first surface of the arm.

7. The transport robot according to claim 1, wherein the arm is configured so as to allow extension/shortening and rotation of the arm.

8. The transport robot according to claim 1, wherein the base portion is configured so as to be perpendicular to the second surface of the base portion and a surface of the heat-receiving plate that faces the second surface, and to be rotatable centering on a central axis that passes through the center of the second surface and the surface of the heat-receiving plate, and the base portion is configured such that when the base portion rotates, the second surface and the surface of the heat-receiving plate are kept parallel to each other.

9. The transport robot according to claim 1, wherein a surface treatment of the second surface for making radiation ratio thereof higher than a radiation ratio of the first surface of the base portion involves increasing surface roughness by blasting particles on a flat surface.

10. The transport robot according to claim 1, wherein a surface treatment of the second surface for making radiation ratio thereof higher than a radiation ratio of the first surface of the base portion involves forming a fluororesin layer.

11. A transport apparatus comprising a vacuum chamber and a transport robot, the transport robot comprising:
    a heat-receiving plate attached to one wall surface of the vacuum chamber;
    a base portion disposed facing and spaced away from the heat-receiving plate; and
    an arm supported by the base portion via a support shaft, and
    the transport robot transporting a substrate by moving the arm,
    wherein the base portion includes a first surface that can face the substrate, and a second surface on the opposite side to the first surface that faces the heat-receiving plate,
    wherein a low radiation ratio portion is formed on the first surface of the base portion.
    wherein a release-side high radiation ratio portion having a radiation ratio that is higher than a radiation ratio of the first surface is formed on the second surface of the base portion, and
    wherein a heat-receiving plate for receiving heat emitted from the release-side high radiation ratio portion is provided, the heat-receiving plate being disposed such that a surface of the heat-receiving plate faces the release-side high radiation ratio portion.

12. The transport apparatus according to claim 11, wherein the arm is plate-shaped and includes a first surface that can face the substrate and a second surface on the opposite side to the first surface, a low radiation ratio portion is formed on the first surface of the arm, and an arm-side high radiation ratio portion with radiation ratio that is higher than a radiation ratio of the first surface of the arm is formed on the second surface of the arm.

13. The transport apparatus according to claim 12, wherein in a region that is on one surface of the vacuum chamber and faces at least the second surface of the arm when the arm moves, a vacuum chamber-side high radiation ratio portion having a radiation ratio that is higher than a radiation ratio in a of the first surface of the arm is provided.

14. The transport apparatus according to claim 11, wherein on the surface of the heat-receiving plate that faces the release-side high radiation ratio portion, a receive-side high radiation ratio portion having a radiation ratio that is higher than a radiation ratio of the first surface of the base portion is formed.

15. The transport apparatus according to claim 11, wherein a reflector for reflecting heat is disposed on the first surface of the base portion.

16. The transport apparatus according to claim 11, wherein before the second surface of the base portion is subjected to a surface treatment for making radiation ratio thereof higher than a radiation ratio of the first surface, one of a flat surface of an aluminum plate and a flat surface of stainless steel is exposed.

17. The transport apparatus according to claim 11, wherein the arm is configured to allow extension/shortening and rotation of the arm.

18. The transport apparatus according to claim 11,
wherein the base portion is configured so as to be perpendicular to the second surface of the base portion and a surface of the heat-receiving plate that faces the second surface, and to be rotatable centering on a central axis that passes through the center of the second surface and the surface of the heat-receiving plate, and the base portion is configured such that when the base portion rotates, the second surface and the surface of the heat-receiving plate are kept parallel to each other.

19. The transport apparatus according to claim 11, wherein a surface treatment of the second surface for making radiation ratio thereof higher than a radiation ratio of the first surface of the base portion involves increasing surface roughness by blasting particles on a flat surface.

20. The transport apparatus according to claim 11, wherein a surface treatment of the second surface for making radiation ratio thereof higher than a radiation ratio of the first surface of the base portion involves forming a fluororesin layer.

* * * * *